(12) United States Patent
Ushiro et al.

(10) Patent No.: US 7,342,254 B2
(45) Date of Patent: Mar. 11, 2008

(54) LIGHT-EMITTING DEVICE HAVING A DIFFRACTIVE FILM ON ITS LIGHT-OUTPUT FACE AND MANUFACTURING METHOD THEREFOR

(75) Inventors: Toshihiko Ushiro, Itami (JP); Soichiro Okubo, Itami (JP); Takashi Matsuura, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 108 days.

(21) Appl. No.: 10/506,258

(22) PCT Filed: Dec. 4, 2003

(86) PCT No.: PCT/JP03/15562

§ 371 (c)(1),
(2), (4) Date: Sep. 1, 2004

(87) PCT Pub. No.: WO2004/054053

PCT Pub. Date: Jun. 24, 2004

(65) Prior Publication Data

US 2005/0230687 A1    Oct. 20, 2005

(30) Foreign Application Priority Data

Dec. 12, 2002  (JP) ............... 2002-360493

(51) Int. Cl.
*H01L 27/15* (2006.01)
(52) U.S. Cl. ............ 257/79; 257/98; 257/E51.08; 257/E33.001
(58) Field of Classification Search .......... 359/3, 359/15, 558–576, 583, 618; 356/329; 372/96–109; 257/79, 88, 98, E51.08, E33.001, E33.077, 257/E33.054
See application file for complete search history.

(56) References Cited

U.S. PATENT DOCUMENTS

| 4,850,681 A | * | 7/1989 | Yamanobe et al. ......... 349/201 |
| 5,038,041 A | * | 8/1991 | Egan ......................... 250/349 |
| 5,044,713 A | * | 9/1991 | Mozer et al. ................ 385/11 |
| 5,245,471 A | * | 9/1993 | Iwatsuka et al. ........... 359/494 |

(Continued)

FOREIGN PATENT DOCUMENTS

JP        S61-127190 A      6/1986

(Continued)

OTHER PUBLICATIONS

T. Glaser et al., "Diffractive optical isolator made of high-efficiency dielectric gratings only," Applied Optics, vol. 41, No. 18, Jun. 20, 2002, pp. 3558-3566.
B. Mroziewicz, et al. "Broad-Area Semiconductor Lasers with Diffraction-Grating Mode Control," Opt. Eng., Society of Photo-Optical Instrumentation Engineers, Bellingham, U.S., vol. 36, No. 7, Jul. 1997, pp. 2037-2044.
R. Magnusson, et al. "New Principle for Optical Filters," Applied Physics Letters, American Institute of Physics, Melville, N.Y., U.S., vol. 61, No. 9, Aug. 31, 1992, pp. 1022-1024.

(Continued)

*Primary Examiner*—Howard Weiss
*Assistant Examiner*—(Vikki) Hoa B Trinh
(74) *Attorney, Agent, or Firm*—James Judge

(57) ABSTRACT

Affords efficiently and at low cost practical, tiny light-emitting devices having an optically diffractive film on their light-output face. A light-emitting device (LD) includes a diffractive film (DF) formed on its light-output face; the diffractive film includes a transparent DLC (diamond-like carbon) layer; and the DLC layer includes a modulated-refractive-index diffraction grating containing local regions of relatively high refractive index and local regions of relatively low refractive index.

14 Claims, 6 Drawing Sheets

U.S. PATENT DOCUMENTS

| | | | |
|---|---|---|---|
| 5,276,537 A * | 1/1994 | Savant et al. | 359/3 |
| 5,353,155 A * | 10/1994 | Miller | 359/618 |
| 5,420,443 A * | 5/1995 | Dreifus et al. | 257/77 |
| 5,614,336 A * | 3/1997 | Mikami et al. | 430/5 |
| 5,631,107 A * | 5/1997 | Tarumi et al. | 430/1 |
| 5,726,805 A * | 3/1998 | Kaushik et al. | 359/589 |
| 5,888,846 A * | 3/1999 | Miyata et al. | 438/105 |
| 5,920,080 A * | 7/1999 | Jones | 257/40 |
| 5,932,354 A * | 8/1999 | Takeda et al. | 428/426 |
| 6,014,255 A * | 1/2000 | Van Der Wal et al. | 359/487 |
| 6,086,796 A * | 7/2000 | Brown et al. | 264/1.33 |
| 6,262,486 B1 * | 7/2001 | Farrar | 257/758 |
| 6,304,312 B1 * | 10/2001 | Tanabe et al. | 349/201 |
| 6,421,481 B1 * | 7/2002 | Sappey | 385/37 |
| 6,447,120 B1 * | 9/2002 | Hansen et al. | 353/20 |
| 6,452,187 B1 * | 9/2002 | Claiborne et al. | 250/370.12 |
| 6,544,716 B1 * | 4/2003 | Hajjar et al. | 430/271.1 |
| 6,555,288 B1 * | 4/2003 | Xu et al. | 430/270.1 |
| 6,597,712 B2 * | 7/2003 | Tatsuno et al. | 372/32 |
| 6,678,297 B2 * | 1/2004 | Kopp et al. | 372/43.01 |
| 6,680,799 B1 * | 1/2004 | Parriaux et al. | 359/569 |
| 6,693,936 B2 * | 2/2004 | Kitaoka et al. | 372/50.11 |
| 6,785,431 B2 * | 8/2004 | Pan et al. | 385/11 |
| 6,795,242 B2 * | 9/2004 | Pan et al. | 359/484 |
| 6,813,076 B2 * | 11/2004 | Okubo et al. | 359/484 |
| 6,819,871 B1 * | 11/2004 | Baldwin et al. | 398/85 |
| 6,856,633 B2 * | 2/2005 | Nasu et al. | 372/34 |
| 6,868,107 B2 * | 3/2005 | Vurgaftman et al. | 372/96 |
| 6,870,970 B2 * | 3/2005 | Leonard et al. | 385/5 |
| 6,895,025 B2 * | 5/2005 | Herble et al. | 372/9 |
| 6,904,066 B2 * | 6/2005 | Huang et al. | 372/21 |
| 6,915,040 B2 * | 7/2005 | Willner et al. | 385/37 |
| 2003/0010992 A1 * | 1/2003 | Lempkowski et al. | 257/98 |
| 2003/0015705 A1 * | 1/2003 | Chason et al. | 257/72 |
| 2003/0021538 A1 * | 1/2003 | Yamamoto | 385/49 |
| 2003/0058536 A1 * | 3/2003 | Huang et al. | 359/495 |
| 2003/0117706 A1 | 6/2003 | Okubo et al. | |
| 2004/0109328 A1 * | 6/2004 | Dahl et al. | 362/555 |
| 2005/0018727 A1 * | 1/2005 | Yoshida et al. | 372/44 |
| 2005/0152037 A1 * | 7/2005 | Shiozaki et al. | 359/573 |

FOREIGN PATENT DOCUMENTS

| | | |
|---|---|---|
| JP | S61-213802 A | 9/1986 |
| JP | S62-177168 A | 8/1987 |
| JP | S64-047082 A | 2/1989 |
| JP | H05-273425 A | 10/1993 |
| JP | H06-013699 A | 1/1994 |
| JP | H06-061566 A | 3/1994 |
| JP | H09-272567 A | 10/1997 |

OTHER PUBLICATIONS

M. R. Taghizadeh, et al. "Design and Fabrication of Diffractive Optical Elements," Microelectronic Engineering, Elsevier Science B.V., Amsterdam, NL, vol. 34, Dec. 1997, pp. 219-242.

* cited by examiner

US 7,342,254 B2

LIGHT-EMITTING DEVICE HAVING A DIFFRACTIVE FILM ON ITS LIGHT-OUTPUT FACE AND MANUFACTURING METHOD THEREFOR

TECHNICAL FIELD

The present invention relates to light-emitting devices that have an optically diffractive film on their light-output face, and to methods of manufacturing such light-emitting devices. More specifically, the invention relates to light-emitting devices that include an optically diffractive film on their output face and that have wavelength-division multiplexing/demultiplexing, power-splitting/combining, polarization-division multiplexing/demultiplexing, wave-plate, or optical-isolator functionality, and to methods of manufacturing such light-emitting devices.

BACKGROUND ART

As is widely known, diffractive optical elements that produce diffraction of light can be employed in a variety of applications. For example, wavelength multiplexers/demultiplexers, optical couplers, optical isolators, and like devices used in optical communications fields can be manufactured employing diffractive optical elements.

Diffractive optical elements generally are manufactured by forming a diffraction-grating layer on a transparent substrate. Diffractive optical elements are grossly divided, based on structural differences in the diffraction-grating layer, into modulated-refractive-index and surface-relief types.

FIG. 13 depicts, in a schematic sectional view, an example of a modulated-refractive-index type of diffractive optical element. It should be understood that in the drawings for the present application, dimensional proportions such as width and thickness have been altered as appropriate in order to clarify and simplify the figures, and do not reflect the proportions in their actual relationships. This modulated-refractive-index optical element includes a diffraction-grating layer 12a formed on a transparent substrate 11, wherein a modulated-refractive-index structure has been created in the diffraction-grating layer 12a. In particular, local regions having a relatively small refractive index $n_1$ and local regions having a relatively large refractive index $n_2$ are periodically formed in alternation in the diffraction-grating layer 12a. This enables the occurrence of a diffraction phenomenon originating in the phase difference that arises between light passing through the regions of low refractive index $n_1$ and light passing through the regions of high refractive index $n_2$.

The diffraction-grating layer 12a having the modulated-refractive-index structure can be formed utilizing for example a material whose refractive index is increased by the material undergoing energy-beam irradiation. For instance, increasing the refractive index of Ge-doped quartz glass by means of ultraviolet irradiation is known. Likewise, irradiating quartz glass with X-rays to increase the refractive index of the glass is known. Accordingly, a diffraction-grating layer 12a as illustrated in FIG. 13 can be created by depositing a quartz-glass layer of refractive index $n_1$ onto a transparent substrate 11 and irradiating the glass layer with an energy beam in a periodic pattern to raise the refractive index locally to $n_2$.

FIG. 14 illustrates, in a schematic sectional view, an example of a surface-relief type of diffractive optical element. This surface-relief diffractive optical element includes a diffraction-grating layer 12b formed on a transparent substrate 11, wherein a relief structure has been embossed in the diffraction-grating layer 12b. In particular, local regions having a relatively large thickness and local regions having a relatively small thickness are periodically formed in alternation in the diffraction-grating layer 12b. This enables the occurrence of a diffraction phenomenon originating in the phase difference that arises between light passing through the regions of large thickness and light passing through the regions of small thickness.

The diffraction-grating layer 12b having the surface-relief structure can be formed by for example depositing a quartz glass layer onto a transparent substrate 11 and employing photolithography and etching to process the glass layer.

FIG. 15 depicts, in a schematic sectional view, one more example of a modulated-refractive-index type of diffractive optical element. The modulated-refractive-index optical element of FIG. 15 resembles that of FIG. 13, but within a diffraction-grating layer 12c in FIG. 15 local regions having refractive indices $n_1$, $n_2$, $n_3$ of three levels that differ from each other are arrayed periodically. Local regions in this way having three levels of refractive indices $n_1$, $n_2$, $n_3$ can be formed within a diffraction-grating layer 12c by for example depositing onto a substrate 11 a quartz glass layer of refractive index $n_1$ and irradiating the glass layer with an energy beam having two different energy levels.

By means of a diffraction grating that contains local regions whose refractive indices are multilevel, diffraction efficiency can be improved by comparison to the case with a diffraction grating that contains regions whose refractive indices are simply binary. "Diffraction efficiency" herein means the ratio of the sum of the diffracted light energies to the energy of the incident light. This means that from the perspective of putting diffracted light to use, greater diffraction efficiency is to be preferred.

FIG. 16 represents, in a schematic sectional view, one more example of a surface-relief type of diffractive optical element. The surface-relief optical element of FIG. 16 resembles that of FIG. 14, but within a diffraction-grating layer 12d in FIG. 16 local regions having thicknesses in three levels that differ from each other are arrayed periodically. Local regions in this way having refractive thicknesses in three levels can be formed within a diffraction-grating layer 12d by for example depositing onto a substrate 11 a quartz glass layer and repeating a photolithographic and etching process on the glass layer two times. Thus by means of a diffraction grating that contains local regions having a multilevel profile, diffraction efficiency can be improved by comparison to the case with a diffraction grating that contains simple binary thicknesses.

It should be noted that while modulated-refractive-index diffraction gratings in which the refractive indices within the diffraction grating layer are varied in stages are illustrated in FIGS. 13 and 15, also formable are modulated-refractive-index diffraction gratings in which the refractive indices are varied continuously. In that case the energy level of the energy beam used for irradiating in order to raise the refractive index should be varied continuously.

FIG. 17 schematically represents an example of the use of a diffractive optical element in an optical communications application. In the figure, collimators C1, C2 are respectively joined to the end faces of optical fibers F1, F2. Laser beam L emitted from the light-output face of a semiconductor laser diode LD providing continuous wavelength tunable output is split by a diffractive optical element DE into, for example, a beam of wavelength $\lambda_1$ and a beam of wavelength $\lambda_2$. This is because the diffraction angle of the beam differs depending on the wavelength $\lambda$. Thus a beam having a wavelength of $\lambda_1$ can be input from collimator C1 into optical fiber F1, while a beam having a wavelength of $\lambda_2$ can be input from collimator C2 into optical fiber F2. In other words, the demultiplexing functionality of the diffractive optical element DE is exploited in this case.

Of course, by introducing a beam of wavelength $\lambda_1$ and a beam of wavelength $\lambda_2$ in the opposite direction in a diffractive optical element DE like that shown in FIG. 17, the beams can be combined into a single light beam L. This means that the diffractive optical element DE represented in FIG. 17 can demonstrate multiplexing/demultiplexing functionality. Thus a diffractive optical element of this sort having wavelength-division multiplexing/demultiplexing functionality is able to perform a crucial role in wavelength-division multiplexed (WDM) optical communications.

Although modulated-refractive-index diffractive optical elements such as described above are manufacturable in principle, in practice producing modulated-refractive-index diffractive optical elements is problematic. The reason is because the amount of refractive-index variation obtainable by irradiating for example quartz glass with an energy beam is at the very most 0.002 or so, which is prohibitive of creating an effective diffraction-grating layer.

Consequently, the general practice at present is—as set forth for example in Patent Reference 1, Japanese Unexamined Pat. App. Pub. No. S61-213802, and in Non-Patent Reference 1, *Applied Optics*, Vol. 41, 2002, pp. 3558-3566—to employ surface-relief types as diffractive optical elements. Nevertheless, the photolithography and etching necessary for fabricating relief diffractive optical elements are considerably complex manufacturing processes requiring a fair amount of time and trouble, besides which controlling the etching depth with precision is no easy matter. What is more, a problem with surface-relief diffractive optical elements is that since microscopic corrugations are formed in the element face, dust and dirt are liable to adhere.

Meanwhile, in a drop optical circuit such as represented in FIG. 17, the diffractive optical element DE, some several mm across, must be aligned and fixed in place with respect to the semiconductor laser LD and the optical fibers F1, F2 atop a (non-illustrated) support base. This means that in a conventional diffractive optical element, the semiconductor laser and the optical fibers are separate, individual optical components, which costs trouble in handling and has been prohibitive of scaling down the optical path.

An object of the present invention, in view of the situation as in the foregoing with prior technology, is efficiently and at low cost to make available practical, tiny light-emitting devices having an optically diffractive film on their light-output face.

Patent Reference 1
  Japanese Unexamined Pat. App. Pub. No. S61-213802.

Non-Patent Reference 1
  *Applied Optics*, Vol. 41, 2002, pp. 3558-3566.

DISCLOSURE OF INVENTION

According to the present invention, a light-emitting device is characterized in including an optically diffractive film formed on its light-output face; the diffractive film, in including a transparent DLC (diamond-like carbon) layer; and the DLC layer, in including a diffraction grating containing local regions of relatively high refractive index and local regions of relatively low refractive index.

A diffractive film of this sort allows a single optical beam that includes a plurality of wavelengths to be split into a plurality of beams depending on the wavelength, and is capable of functioning as a wavelength-division multiplexer/demultiplexer that can cause a plurality of beams having different wavelengths to combine into a unitary optical beam.

The diffractive film as such also allows an optical beam of a single wavelength to be split into a plurality of beams, and is capable of functioning as a power splitter/combiner that can cause a plurality of single-wavelength beams to combine into a unitary optical beam.

Moreover, a diffractive film of this sort is capable of functioning as a polarization-division multiplexer/demultiplexer that can cause TE waves and TM waves contained in an optical beam of a single wavelength to separate and to unite. The diffractive film as such is also capable of functioning as a wave plate with respect to either TE waves or TM waves contained in a single-wavelength optical beam.

Another possibility according to the present invention is creating optical-isolator functionality in the diffractive film by combining therein a first DLC layer containing a diffraction grating having the above-described polarization-division demultiplexing functionality, with a second DLC layer containing a diffraction grating having wave-plate functionality. If the thickness of a diffractive film thus having optical-isolator functionality is 20 µm or less, then the end face of an optical fiber can be abutted on and connected to the beam-output portion of a light-emitting device via the diffractive film without a collimator or condenser being required. The reason why is because the optical divergence in a micro-distance of 20 µm or less is negligible. Here, a transparent interlayer may be inserted in between the first DLC layer and the second DLC layer in the diffractive film having optical-isolator functionality.

Furthermore, the diffraction grating that the diffractive film includes can be such that the grating is functional with respect to light containing wavelengths within a range of from 0.8 µm to 2.0 µm.

In a method according to the present invention of manufacturing a light-emitting device as related above, the high refractive-index regions contained in the diffraction grating(s) can be formed by irradiating the DLC layer(s) in a predetermined pattern with an energy beam to raise the refractive index of the layer(s).

In an implementation in which a transparent interlayer is inserted in between the first DLC layer and the second DLC layer to create optical-isolator functionality, the first DLC layer can be deposited onto the light-output face of the light-emitting device and irradiated with an energy beam to form in a first predetermined pattern the high-refractive index regions in the first DLC layer; the transparent interlayer and the second DLC layer can be deposited in turn; and the second DLC layer can be irradiated with an energy beam to form in a second predetermined pattern the high-refractive index regions therein; wherein when the second DLC layer is being irradiated in the second predetermined pattern with an energy beam, the transparent interlayer can act to prevent the energy beam from having an effect on the first DLC layer.

The energy beam for raising refractive index can be chosen from an X-ray beam, an electron beam, or an ion beam, and the DLC layer(s) can be deposited by a plasma CVD technique.

BEST MODE FOR CARRYING OUT THE INVENTION

Figure 1:
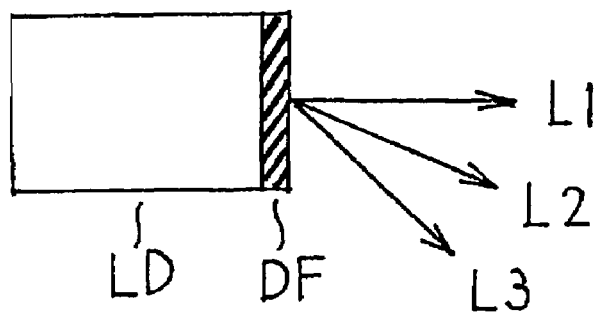
FIG. 1 is a schematic view representing in the present invention a light-emitting device having a diffractive film on its light-output face.

FIG. 1 schematically depicts one example of a light-emitting device according to the present invention.

An optically diffractive film DF including a transparent DLC (diamond-like carbon) layer is formed on the light-output face of the light-emitting device LD. The DLC layer contains a modulated-refractive-index diffraction grating formed by irradiating the layer with an energy beam such as an ion beam to raise the refractive index locally. Accordingly, the optical beam emitted from the light-emitting device LD is diffracted by the diffractive film DF and separated into a plurality of beams—such as L1, L2 and L3 for example—depending on the diffraction angle.

Embodiment 1

Figure 2:
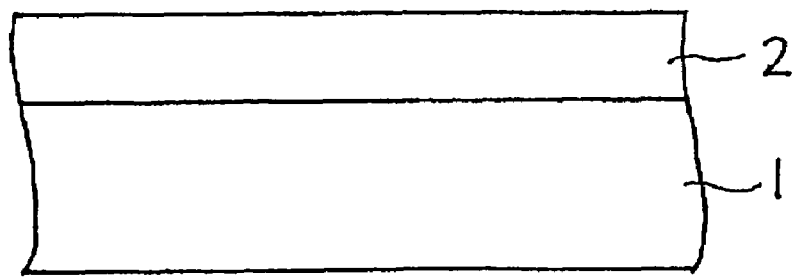
FIG. 2 is a schematic sectional view depicting an example of a stage in a technique for manufacturing a diffractive film in the present invention.
Figure 3:
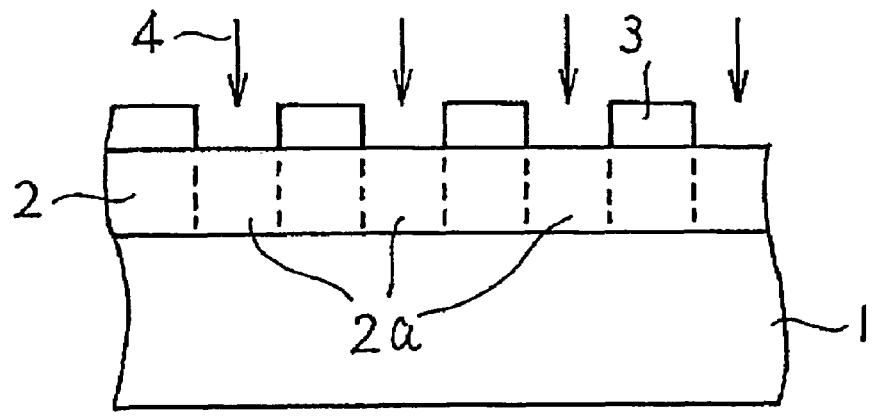
FIG. 3 is a schematic sectional view depicting an example of a stage in a technique for manufacturing a diffractive film in the present invention.
Figure 4:
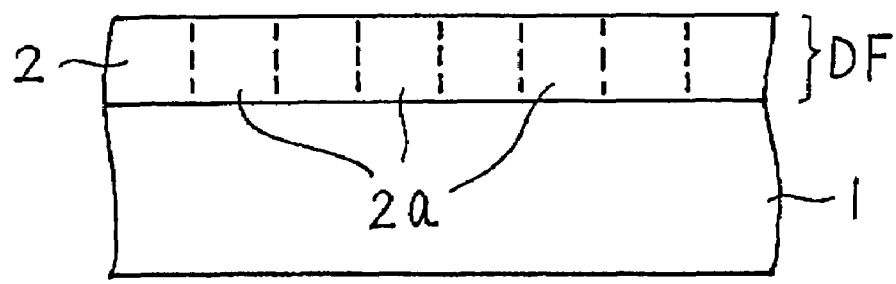
FIG. 4 is a schematic sectional view depicting an example of a stage in a technique for manufacturing a diffractive film in the present invention.

FIGS. 2 through 4 are schematic sectional views that depict one example of a method of manufacturing a modulated-refractive-index diffractive film in Embodiment 1 of the present invention.

Onto an $SiO_2$ substrate 1, as represented in FIG. 2, having a 1.44 refractive index and having a 5 mm×5 mm principal face, a DLC layer 2 was deposited by plasma CVD to a thickness of 2 µm.

A gold mask 3 in FIG. 3 was formed onto the DLC layer 2 by a lift-off technique. In the gold mask 3, gold stripes of 0.5 µm width and 5 mm length were arrayed in iterations at a pitch of 0.5 µm. That is, the gold mask 3 had a "line & space" pattern. The DLC layer 2 was thereafter implanted in an orthogonal direction through the apertures in the gold mask 3 with an He ion beam 4 at a dose of $5 \times 10^{17}/cm^2$ under an 800-keV acceleration voltage.

As a result, the regions within the DLC layer that were not implanted with He ions had a refractive index of 1.55, while the refractive index of the regions 2a that were implanted with He ions was raised to 2.05. Such refractive-index variation in a DLC layer was far larger by comparison to refractive-index variation that can be produced in quartz glass, enabling a diffraction-grating layer of sufficiently large diffraction efficiency to be created.

In FIG. 4, etching removal of the gold mask 3 has yielded a modulated-refractive-index diffractive film DF. It will be appreciated that the diffraction-grating layer 2 in this diffractive film DF contains regions of two types—refractive index 1.55 and 2.05—and thus is a so-called binary-level diffraction-grating layer.

Figure 5:
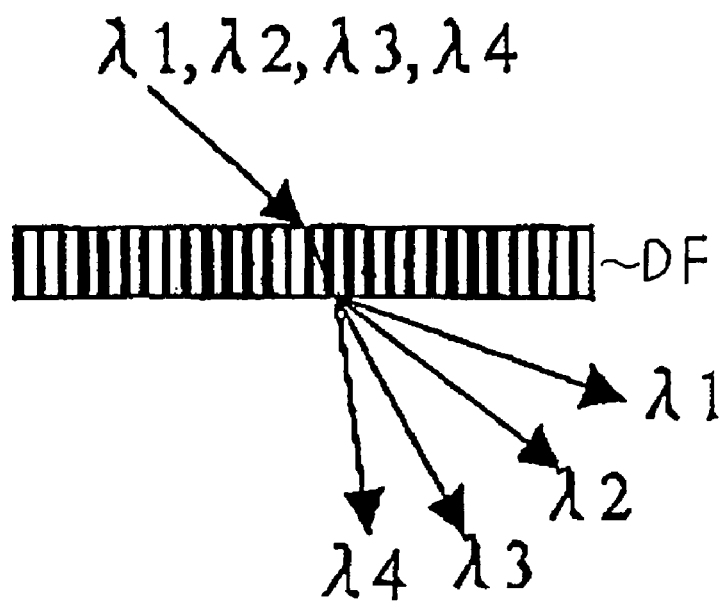
FIG. 5 is a schematic sectional view depicting the wavelength-demultiplexing action of a wavelength-division multiplexer/demultiplexer in the present invention.

FIG. 5 depicts in a schematic sectional view wavelength-demultiplexing action in an implementation in which the obtained modulated-refractive-index diffractive film DF was utilized as a wavelength-division multiplexer/demultiplexer. In this sectional drawing, the section areas in black represent regions of relatively high refractive index, while the section areas in white represent regions of relatively low refractive index. As is indicated in FIG. 5, if a single optical beam containing a plurality of wavelengths $\lambda_1$, $\lambda_2$, $\lambda_3$, $\lambda_4$, for example, is made incident onto the diffractive film DF, the diffraction angles of the rays that pass through the diffractive film differ from one another depending on the wavelength. This means that a single incident beam containing a plurality of wavelengths can be separated into a plurality of diffraction beams that wavelength by wavelength differ in advancing direction.

Of course, it should be evident that if the sense of the incident light beam and the diffraction beams indicated by the arrows in FIG. 5 is reversed, the diffractive film DF in FIG. 5 can be utilized as a multiplexer. It is to be noted that in implementations in which the diffractive film is utilized as a wavelength division demultiplexer, the optical beam is generally made incident on the diffractive film at a suitable angle within a range of 0-70 degrees or so relative to a line normal to the film surface. This angle range, however, relates to the situation in which the high refractive-index regions have been formed in an orientation orthogonal to the face of the DLC layer; in a case in which, with the ion beam being diagonally directed onto the DLC layer face, the high refractive-index regions have been formed in the surface of the DLC layer at a slant for example, the incident angle of the optical beam would be adjusted taking the angle of slant into consideration.

In the present Embodiment 1, a diffractive film DF having a line & space pattern—in which by diagonal irradiation with an ion beam, gold stripes of 0.5 μm width were arrayed in iterations at a pitch of 0.5 μm—was formed onto the light-output face of an ASE (amplified spontaneous emission) laser diode LD. (ASE laser diodes are laser devices that are able to emit a laser beam containing continuous wavelengths.)

Figure 6:
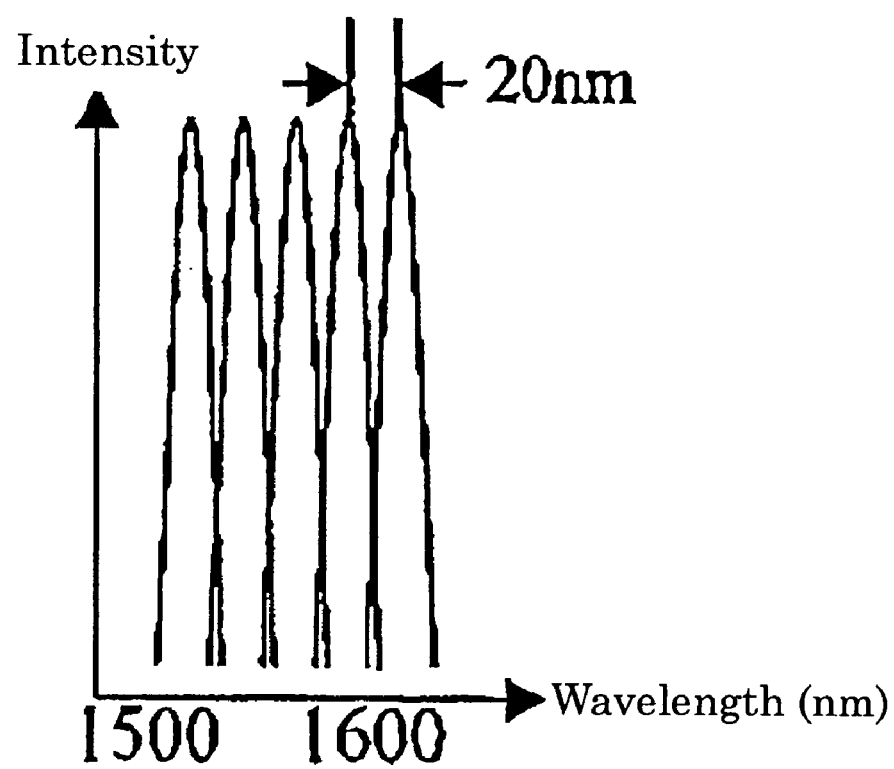
FIG. 6 is a graph showing one example of the relationship between wavelength and intensity distribution of light demultiplexed by a wavelength-division multiplexer/demultiplexer in the present invention.

FIG. 6 is a graph that schematically represents one example of wavelength-demultiplexing results in the diffractive film DF formed onto the light-output face of an ASE laser diode LD as such. The horizontal axis in the graph represents diffraction-light wavelength (nm), while the vertical axis represents the diffraction-light intensity in arbitrary units. Five diffraction beams having wavelengths distributed at 20-nm intervals in a spectrum from 1.5 μm to 1.6 μm as shown in FIG. 6 were produced as an optical beam emitted from the ASE laser diode LD via the diffractive film DF, with the five diffraction beams having approximately equal intensity. And with the diffraction efficiency in that case then being nearly 99%, quite outstanding wavelength demultiplexing properties were achieved.

It should be understood that in Embodiment 1, because a linear, one-dimensional diffraction-grating pattern is utilized the plural diffraction beams are present lying in a single plane that contains the incident beam. Nevertheless, it will be understood that by utilizing a two-dimensional diffraction-grating pattern—as in Embodiment 2, which will be set forth next—in an orthogonal sectional plane the plural diffraction beams can be distributed two-dimensionally.

Embodiment 2

Figure 7:
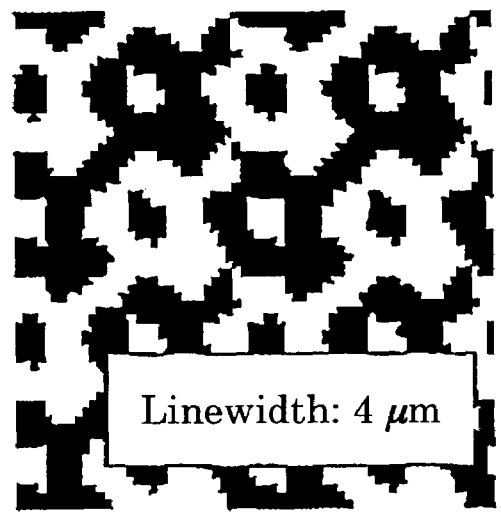
FIG. 7 is a schematic plan view showing an example of a diffraction-grating pattern in an optical power splitter in the present invention.

FIG. 7 shows, in a schematic plan view, a two-dimensional diffraction-grating pattern in a diffractive film in Embodiment 2. The diffractive film in Embodiment 2 can be fabricated by the same manufacturing process as was the case with Embodiment 1. In particular, the black regions in FIG. 7 represent where within the DLC layer the refractive index was raised by irradiating the regions with the He ion beam, while the white areas represent regions that were not irradiated with the He ion beam. The black pattern was formed by combining 4 μm×4 μm microcells, and therein had a periodicity of 132 μm. This means that the minimum linewidth in the diffraction-grating pattern illustrated in FIG. 7 is 4 μm.

Figure 8:
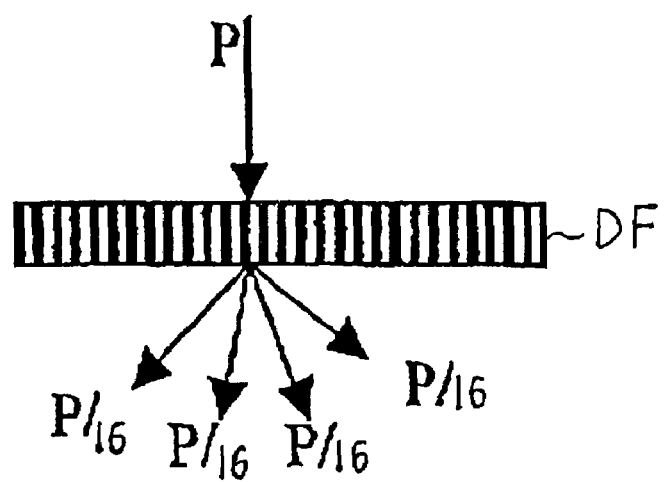
FIG. 8 is a schematic sectional view depicting the power-splitting action in an optical power splitter in the present invention.

FIG. 8 depicts, in a schematic sectional view, power-splitting action in a case in which the modulated-refractive-index diffractive film in Embodiment 2 is employed as an optical coupler (power splitting device). In particular, if a beam of light of a single wavelength is made incident on the diffractive film DF, the diffraction angle of the rays that pass through the diffractive film differ from one another depending on the order of diffraction. Consequently, an incident beam of a single wavelength can be separated into a plurality of optical diffraction beams.

Figure 9:
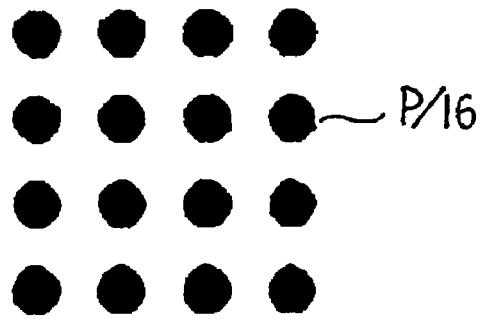
FIG. 9 is a planar view showing the beam distribution within a plane intersecting a plurality of diffraction beams from power-splitting by the optical power splitter of FIG. 7.

FIG. 9 is a plan view representing beam distribution within a plane orthogonal to a diffraction beam having been power-split, as in FIG. 8, into a plurality by the optical coupler of FIG. 7. More specifically, an incident beam having power P can be split into 16 diffraction beams each having power P/16.

In embodiment 2, a diffractive film DF having a diffraction-grating pattern as is illustrated in FIG. 7 was formed onto the light-output face of a DFB (distributed feedback) laser diode (cf. FIG. 1) that emits a beam 1.55 μm in wavelength. (DFB laser diodes are devices that emit single-wavelength laser light whose width at half-maximum is extremely narrow.) As the optical beams emitted in this implementation from the DFB laser diode LD via the diffractive film DF, diffraction beams in 16 splits distributed in four-fold symmetry as is represented in FIG. 9 were produced.

It will be appreciated that a diffraction-grating pattern of FIG. 7 enabling the realization of a plural-diffraction-beam distribution pattern as is shown in FIG. 9 can, as is widely known, be found using a Fourier transform.

Embodiment 3

In Embodiment 3, a light-emitting device including a diffractive film having polarization-division multiplexing/demultiplexing functionality was fabricated. In Embodiment 3 as well, a DLC diffraction-grating layer having a line & space pattern was formed by the same manufacturing process as was the case with Embodiment 1. In Embodiment 3, however, high refractive-index regions of 0.4 μm width were arrayed in iterations at a pitch of 0.4 μm.

Figure 10:
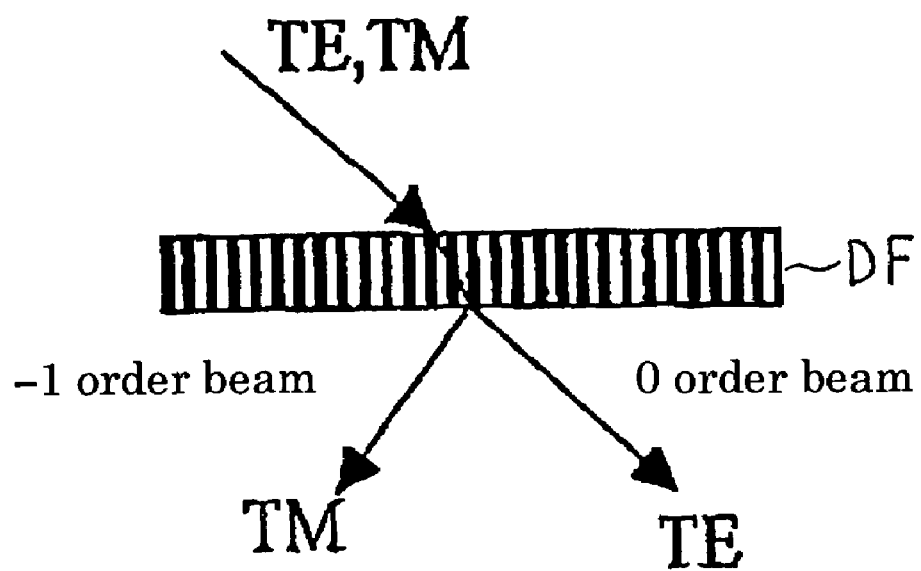
FIG. 10 is a schematic sectional view depicting the polarization-demultiplexing action in a polarization demultiplexer in the present invention.

FIG. 10 depicts in a schematic sectional view polarization-demultiplexing action in an implementation in which the modulated-refractive-index diffractive film DF in Embodiment 3 is employed as a polarization-division multiplexer/demultiplexer. In particular, if a TEM wave including a TE component and a TM component is made incident on the diffractive film DF in Embodiment 3, the TE wave and the TM wave will, depending on the difference in polarization between them, be diffracted at diffraction angles that differ from each other. For example, as is illustrated in FIG. 10, the TE wave is obtained as a 0 order diffraction beam, while the TM wave is obtained as a −1 order diffraction beam. The splitting off of TE and TM waves is in this way made possible.

In Embodiment 3, a diffractive film DF having a diffraction-grating pattern—in which by diagonal irradiation with an ion beam, high refractive-index regions of 0.4 μm width were arrayed in iterations at a pitch of 0.4 μm—was formed onto the light-output face of a DFB laser diode LD (cf. FIG. 1) that emits a beam 1.55 μm in wavelength. As the optical beams emitted in this implementation from the DFB laser diode LD via the diffractive film DF, a TE-polarized beam and a TM-polarized beam could be split off.

Embodiment 4

In Embodiment 4, a diffractive film DF having wave-plate functionality was formed onto the light-output face of a DFB laser diode LD (cf. FIG. 1) that emits a beam 1.55 μm in wavelength. With the diffractive film of Embodiment 4 as well, a DLC diffraction-grating layer having a line & space pattern was formed by the same manufacturing process as was the case with Embodiment 1. In Embodiment 4, however, high refractive-index regions of 0.2 μm width were arrayed in iterations at a pitch of 0.2 μm.

Although the laser beam emitted from a DFB laser diode ordinarily is linearly polarized, the beam emitted from a DFB laser diode as in Embodiment 4, in which a diffractive film DF was formed onto the diode's light-output face, was converted into circularly polarized light 1.55 μm in wavelength. This means that the diffractive film DF in Embodiment 4 functioned as a quarter-wave plate, producing a polarization conversion effect.

Embodiment 5

Figure 11:
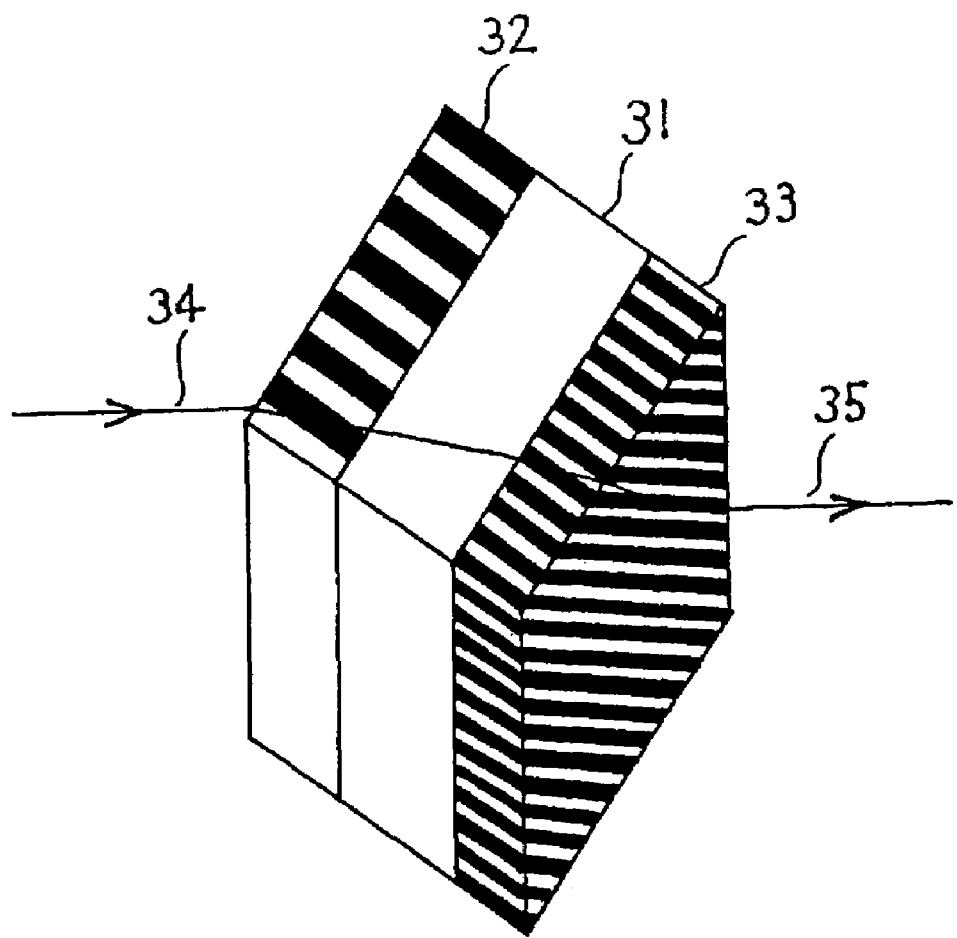
FIG. 11 is a schematic axonometric drawing depicting the functioning of a diffractive film in the present invention capable of operating as an optical isolator.

FIG. 11, a schematic axonometric drawing, models the functioning as an optical isolator of a diffractive optical element, in Embodiment 5, that is practicable for a light-emitting device. In this diffractive optical element a first DLC layer 32 has been formed onto a first principal face of a quartz glass substrate 31, and a second DLC layer 33 has been formed onto the second principal face. Then the same diffraction grating as in Embodiment 3 has been formed in the first DLC layer 32, and the same diffraction grating as in Embodiment 4 has been formed in the second DLC layer 33.

If laser beam of 1.55 μm wavelength is made incident on the diffractive optical element of FIG. 11, though a ray 35 having passed through the first diffraction-grating layer 32, functioning as a polarization demultiplexer, and the second, diffraction optics layer 33, functioning as a quarter-wave plate, is back-reflected from some object, it cannot pass through the quarter-wave plate 33 and the polarization demultiplexer 32—which operate interactively as an optical isolator—and return.

Figure 12:
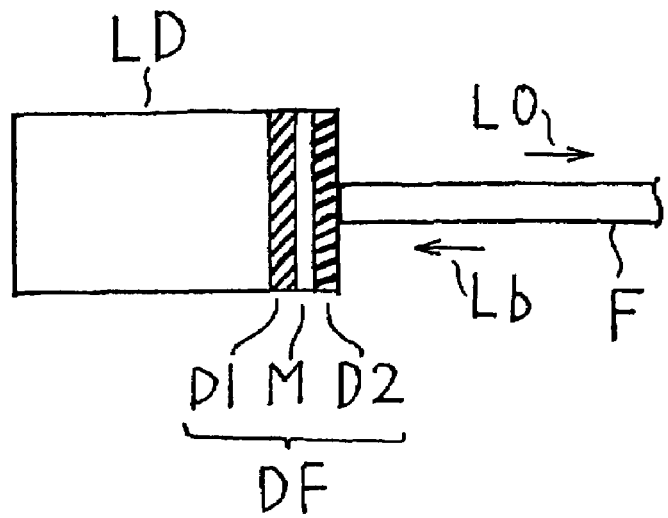
FIG. 12 is a schematic view depicting a light-emitting device having in an end thereof an optical isolator according to the present invention.
Figure 13:
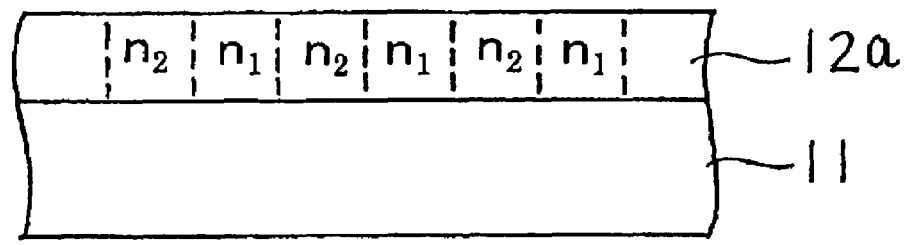
FIG. 13 is a schematic sectional view representing an example of a conventional modulated-refractive-index type of diffractive optical element.
Figure 14:
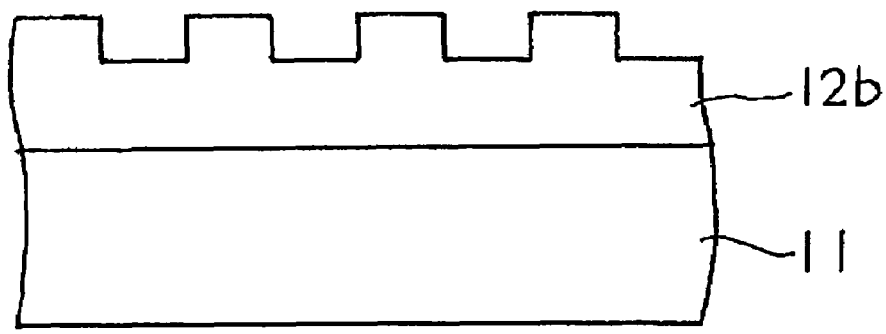
FIG. 14 is a schematic sectional view illustrating an example of a conventional surface-relief type of diffractive optical element.
Figure 15:
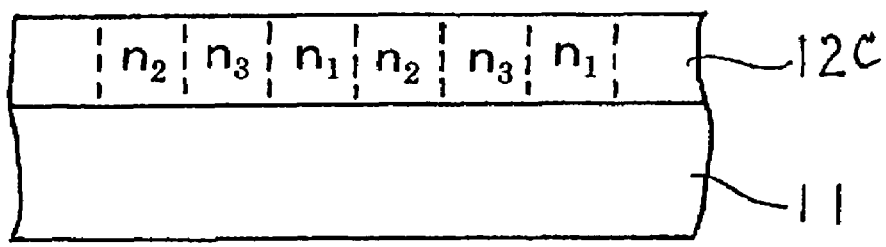
FIG. 15 is a schematic sectional view representing one more example of a conventional modulated-refractive-index type of diffractive optical element.
Figure 16:
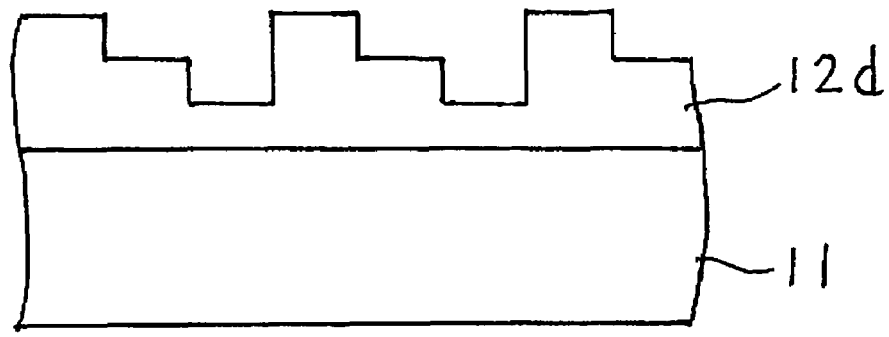
FIG. 16 is a schematic sectional view illustrating one more example of a conventional surface-relief type of diffractive optical element.
Figure 17:
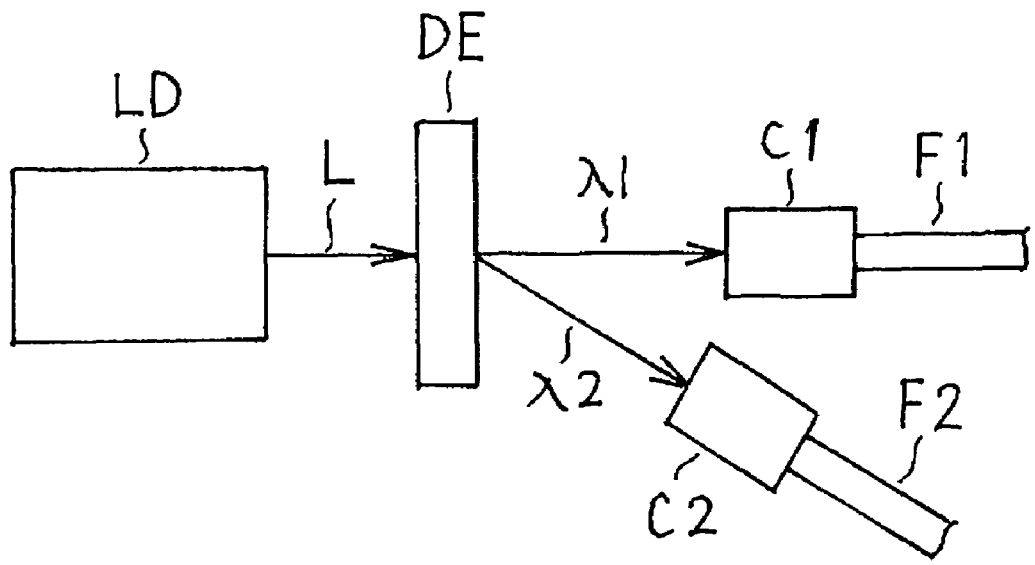
FIG. 17 is a schematic view representing a conventional wavelength-demultiplexing circuit in optical communications.

As represented schematically in FIG. 12, in Embodiment 5 a diffractive film DF having optical-isolator functionality was formed onto the light-output face of a DFB laser diode LD. With this diffractive film, a first DLC layer D1 was formed onto the light-output face of the laser diode LD, and the same diffraction grating as in Embodiment 3 having polarization-demultiplexing functionality was formed in the first DLC layer D1. After that, an $SiO_2$ interlayer M and a second DLC layer D2 were in turn formed onto the first DLC layer D1. It will be appreciated that the $SiO_2$ interlayer and the second DLC layer D2 can be formed by a CVD technique or an EB (electron beam) vapor deposition technique. Then the same diffraction grating as in Embodiment 4 having quarter-waveplate functionality was formed in the second DLC layer D2. In doing so, while the second DLC layer D2 was being irradiated with the ion beam the interlayer M dependably prevented the ion beam from entering the first DLC layer D1.

Of note here is the fact that the diffractive film DF in FIG. 12 has a whole thickness of 20 μm or less. In an implementation in which the diffractive film DF in this way has a thickness of 20 μm or less, the end face of an optical fiber F can be abutted on the beam-output area of the light-emitting device LD via the diffractive film without collimating or condensing lenses being required. The reason why is because at a micro-separation of 20 μm or less, influence from optical-beam divergence need not be taken into consideration.

Figure 18:
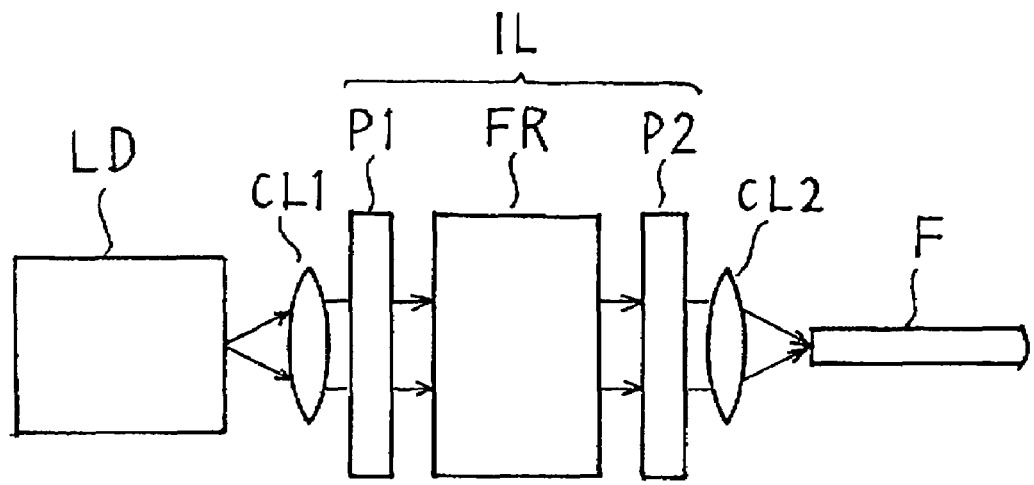
FIG. 18 is a schematic view representing a conventional isolator used in optical communications.

For reference, a conventional isolator used in optical communications is schematically represented in FIG. 18. In this figure, the light rays emitted from the light-emitting device LD are made parallel rays by means of a collimating lens CL1. After passing a first polarizer P1, a Faraday rotator FR, and a second polarizer P2, which are included in an isolator IL, the parallel rays are introduced into an optical fiber F via a condensing lens CL2.

As is clear from a comparison of FIGS. 12 and 18, in Embodiment 5, an optical fiber can be abutted on and connected to a light-emitting device LD via an optical isolator in a extraordinarily compact fashion relative to what as been the case to date.

An optical beam of 1.55 μm wavelength from, as represented in FIG. 12, the light-emitting device LD was introduced into the optical fiber F via the diffractive film DF. In this implementation, though a beam L0 having passed through the first diffraction-grating layer D1, acting as a polarization demultiplexer, and the second diffraction-grating layer D2, acting as a quarter-wave plate, after being introduced into the optical fiber F was back-reflected at an interface and came back as beam Lb, the light could not pass through the quarter-wave plate D2 and the polarization demultiplexer D1, operating interactively as an optical isolator, and return into the light-emitting device LD. As the extinction ratio in that instance—being the ratio of the incident luminous intensity to the transmitted luminous intensity of light returning to the first diffraction-grating layer D1—a value of over 40 dB was obtained.

While in the foregoing embodiments examples in which He ion irradiation was employed to raise the refractive index of the DLC layers were explained, it will be appreciated that ion irradiation of other kinds, X-ray irradiation, or electron-beam irradiation for example can also be employed in order to raise the refractive index of the DLC layers. Likewise, in the above-described embodiments explanation regarding incident light within a range of wavelengths from 1.5 μm to 1.6 μm was made, but in the present invention light-emitting devices having a diffractive film usable for light having any wavelengths within a 0.8 μm to 2.0 μm band with the potential of being employed in optical communications applications can be manufactured.

Furthermore, although in the above-described embodiments, light-emitting devices having a diffractive film containing a binary-level diffraction grating layer were explained, it will be readily appreciated that diffraction gratings with multilevel or continuously modulated refractive index profiles can also be formed within the DLC layers. In such cases, the DLC layers may be irradiated with an energy beam in which the energy level and/or dose is varied.

Still further, in the embodiments described above DFB and ASE laser diodes were exemplified, but it will be readily apparent that the present invention is applicable to other models of laser diode, such as Fabry-Perot types for example. Likewise, it will also be readily appreciated that the present invention is not limited to laser diodes, but is also applicable to other light-emitting devices such as light-emitting diodes.

INDUSTRIAL APPLICABILITY

As given in the foregoing, the present invention enables practical light-emitting devices having a modulated-refractive-index diffractive film on their light-output face to be made available efficiently and at low-cost. Moreover, in modulated-refractive-index diffractive films made realizable by utilizing DLC layers, since microscopic corrugations are not present in the surface as with surface-relief diffractive optical elements, the surface is unlikely to be contaminated, and even if it is contaminated can be readily cleansed. What is more, because its DLC layer has high resistance to wear, a diffractive film of the present invention formed on the light-output face of a light-emitting device is advantageous from the perspective that the film surface is unsusceptible to damage.

The invention claimed is:
1. A light-emitting device comprising:
a light-emitting element;
a light-output face having an optically diffractive film disposed thereon;
a transparent diamond-like carbon (DLC) layer included in said diffractive film; and a modulated-refractive-index diffraction grating implanted orthogonally into said DLC layer with an ion beam at a dosage and acceleration voltage selected to impart into said diffraction grating local regions of relatively high refractive index and local regions of relatively low refractive index differing in refractive index by at least 0.01.

2. A light-emitting device as set forth in claim 1, wherein said diffractive film allows a single optical beam including a plurality of wavelengths to be split into a plurality of beams depending on the wavelength, and functions as a wavelength-division multiplexer/demultiplexer for causing a plurality of beams having different wavelengths to combine into a unitary optical beam.

3. A light-emitting device as set forth in claim 1, wherein said diffractive film allows a single-wavelength optical beam to be split into a plurality of beams, and functions as a power splitter/combiner for causing a plurality of single-wavelength beams to combine into a unitary optical beam.

4. A light-emitting device as set forth in claim 1, wherein said diffractive film functions as a polarization-division multiplexer/demultiplexer for causing TE waves and TM waves contained in a single-wavelength optical beam to separate and to unite.

5. A light-emitting device as set forth in claim 1, wherein said diffractive film functions as a wave plate with respect to either TE waves or TM waves contained in a single-wavelength optical beam.

6. A light-emitting device comprising:
a light emitting element;
a light output face including an optically diffractive film, the optically diffractive film including a first transparent diamond-like carbon (DLC) layer and a second transparent DLC layer laminated in turn onto the light-output face;
a first modulated-refractive-index diffraction grating implanted orthogonally into said first DLC layer with an ion beam at a dosage and acceleration voltage selected to impart into said first diffraction grating local regions of relatively high refractive index and local regions of relatively low refractive index differing in refractive index by at least 0.01; and
a second modulated-refractive-index diffraction grating implanted orthogonally into said second DLC layer with an ion beam at a dosage and acceleration voltage selected to impart into said second diffraction grating local regions of relatively high refractive index and local regions of relatively low refractive index differing in refractive index by at least 0.01; wherein
said first DLC layer has polarization-division demultiplexing functionality for splitting by polarization TE waves and TM waves contained in a single-wavelength optical beam;
said second DLC layer has wave-plate functionality with respect to either TE waves or TM waves contained in a single-wavelength optical beam; and
said first and second DLC layers function interactively as an optical isolator.

7. A light-emitting device as set forth in claim 6, wherein said diffractive film has a whole thickness of 20 μm or less.

8. A light-emitting device as set forth in claim 6, further comprising a transparent interlayer inserted between said first DLC layer and said second DLC layer.

9. A light-emitting device as set forth in claim 1, wherein said diffraction grating is functional with respect to light containing wavelengths within a range of from 0.8 μm to 2.0 μm.

10. A light-emitting device as set forth in claim 6, wherein said first and second diffraction gratings are functional with respect to light containing wavelengths within a range of from 0.8 μm to 2.0 μm.

11. The light emitting device of claim 1, wherein the light-emitting element is selected from the group consisting of lasers and diodes.

12. The light emitting device of claim 6, wherein the light-emitting element is selected from the group consisting of lasers and diodes.

13. A light-emitting device as set forth in claim 1, wherein the difference in refractive index between the high- and low-refractive index regions in said modulated-refractive-index diffraction grating is at least about 0.5.

14. A light-emitting device as set forth in claim 6, wherein the difference in refractive index between the high- and low-refractive index regions in said first and second modulated-refractive-index diffraction gratings is at least about 0.5.

* * * * *